United States Patent
Baba

(10) Patent No.: US 7,386,083 B2
(45) Date of Patent: Jun. 10, 2008

(54) PHASE COMPARATOR HAVING A FLIP-FLOP CIRCUIT AND A LOGIC CIRCUIT

(75) Inventor: Mitsuo Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 495 days.

(21) Appl. No.: 10/442,951

(22) Filed: May 22, 2003

(65) Prior Publication Data

US 2003/0219090 A1 Nov. 27, 2003

(30) Foreign Application Priority Data

May 23, 2002 (JP) ............................. 2002-149175

(51) Int. Cl.
*H04L 25/00* (2006.01)
(52) U.S. Cl. ...................................... 375/371; 375/326
(58) Field of Classification Search ................ 375/376, 375/371, 373, 326, 327
See application file for complete search history.

(56) References Cited

U.S. PATENT DOCUMENTS

| | | | |
|---|---|---|---|
| 3,614,635 A * | 10/1971 | LaPine et al. | 327/113 |
| 5,237,554 A * | 8/1993 | Senshu et al. | 369/59.2 |
| 6,236,696 B1 | 5/2001 | Aoki et al. | |
| 6,249,188 B1 * | 6/2001 | Kaneko | 331/17 |

FOREIGN PATENT DOCUMENTS

| | | |
|---|---|---|
| JP | 6-132817 A | 5/1994 |
| JP | 10-22799 A | 1/1998 |
| JP | 2000-68991 A | 3/2000 |
| JP | 2001-144592 A | 5/2001 |

OTHER PUBLICATIONS

J. Savoj et al., "5.3 A 10Gb/s CMOS Clock and Data Recovery Circuit with Frequency Detection", ISSOC 2001/Session 5/Gigabit Optical Communications I/5.3.

* cited by examiner

*Primary Examiner*—Kevin Kim
(74) *Attorney, Agent, or Firm*—Sughrue Mion, PLLC

(57) ABSTRACT

A phase comparator has a flip-flop circuit and a logic circuit. The flip-flop circuit compares an input clock signal with a leading edge and a trailing edge of an input data signal to produce a leading phase comparison result signal indicative of a leading phase comparison result related to the leading edge of the input data signal and a trailing phase comparison result signal indicative of a trailing phase comparison result related to the trailing edge of the input data signal. The logic circuit produces an output up signal when both of the leading and the trailing phase comparison result signals indicate a lag phase of the input clock signal. The logic circuit produces an output down signal when both of the leading and the trailing phase comparison result signals indicate a lead phase of the input clock signal.

15 Claims, 12 Drawing Sheets

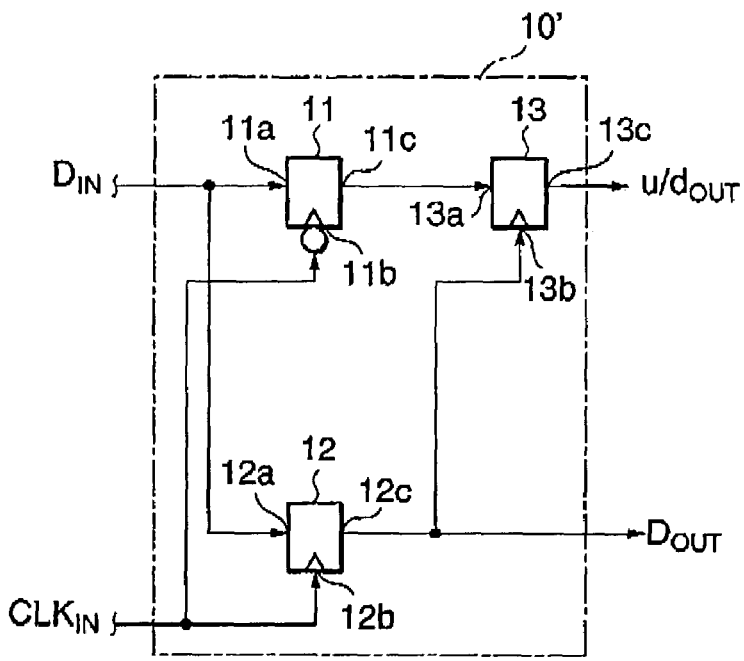
FIG. 1 PRIOR ART
FIG. 2A
PRIOR ART
FIG. 3A
PRIOR ART
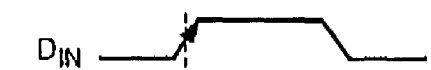
FIG. 2B
PRIOR ART
FIG. 3B
PRIOR ART
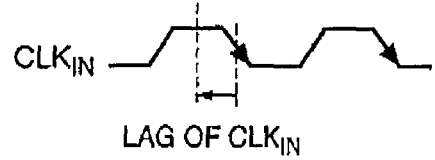
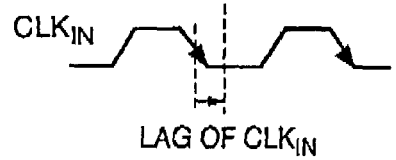
FIG. 2C
PRIOR ART
FIG. 3C
PRIOR ART

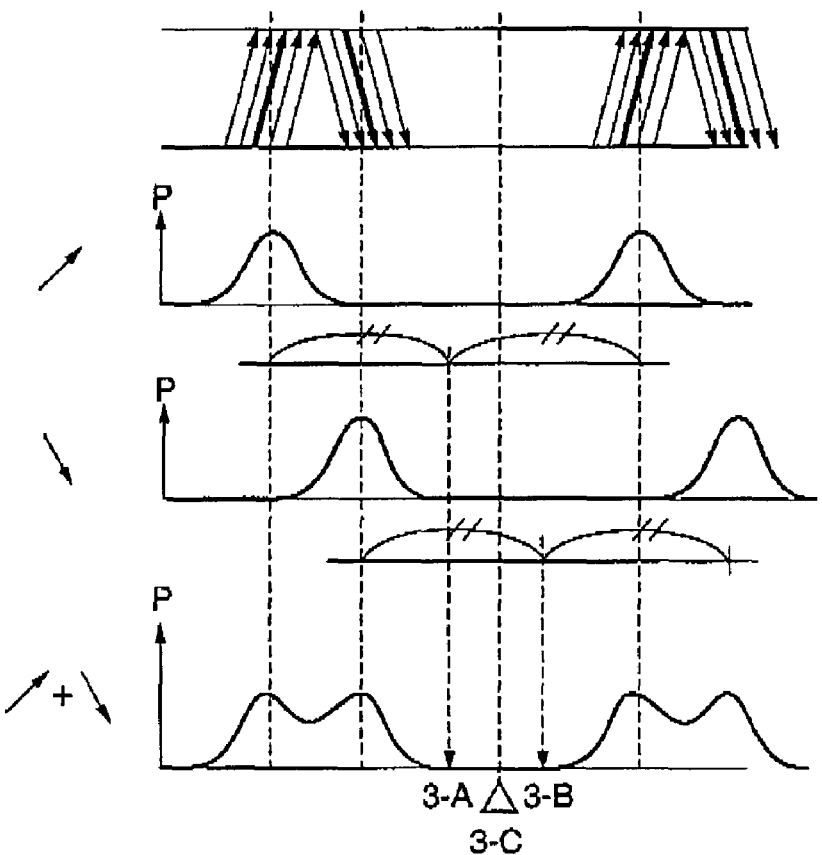

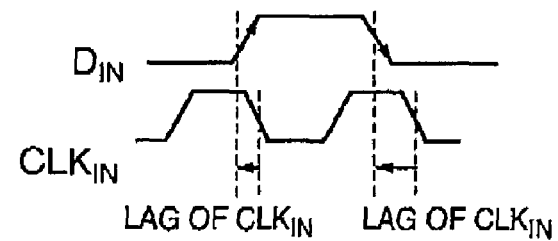
FIG. 7A $D_{IN}$
FIG. 7B $CLK_{IN}$
LAG OF $CLK_{IN}$   LAG OF $CLK_{IN}$
FIG. 7C $u_{OUT}$ "1" "0"
FIG. 7D $d_{OUT}$ "1" "0"
FORWARD CONTROL
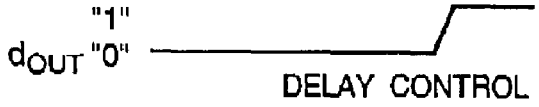
FIG. 8A $D_{IN}$
FIG. 8B $CLK_{IN}$
LEAD OF $CLK_{IN}$   LEAD OF $CLK_{IN}$
FIG. 8C $u_{OUT}$ "1" "0"
FIG. 8D $d_{OUT}$ "1" "0"
DELAY CONTROL
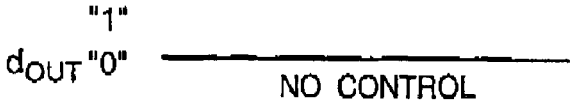
FIG. 9A $D_{IN}$
FIG. 9B $CLK_{IN}$
LEAD OF $CLK_{IN}$   LAG OF $CLK_{IN}$
FIG. 9C $u_{OUT}$ "1" "0"
FIG. 9D $d_{OUT}$ "1" "0"
NO CONTROL

PHASE COMPARATOR HAVING A FLIP-FLOP CIRCUIT AND A LOGIC CIRCUIT

BACKGROUND OF THE INVENTION

This invention relates to a phase comparator applied to a clock data recovery (CDR) circuit which mainly is integrated in a digital large scale integration (LSI) circuit and which is used in purposes necessary to operate at a high speed.

The phase comparators applied to the CDR circuit of the type described are composed of all of digital logic to be adapted to binary result outputs. Such types of the phase comparators are mostly adopted which are exemplified by ISSCC 2001 J. Savoi, B. Razavi, or the like. The phase comparators of the type described are generally called a bang-bang type in the art. The phase comparator of the bang-bang type is characterized in that it has a large gain and a large noise-resistance and it is easy to design to operate at a high-speed.

In the manner which will later be described in conjunction with FIG. 1, a conventional phase comparator of the type described comprises a flip-flop circuit consisting of first through third D-type flip-flops. The flip-flop circuit is supplied with an input data signal having a digital signal format and an input clock signal for use in data extraction. The input data signal is a received data signal. The first through the third D-type flip-flops are called first through third latch circuits, respectively. Each of the first through the third latch circuits has a data input terminal, a clock input terminal, and a data output terminal. The first latch circuit carries out a latch operation in synchronism with a trailing edge of a signal supplied to the clock input terminal thereof while each of the second and the third latch circuit carries out a latch operation in synchronism with a leading edge of a signal supplied to the clock terminal thereof.

The first latch circuit has a first data input terminal supplied with the input data signal and a first clock input terminal supplied with the input clock signal. The first latch circuit latches the input data signal in synchronism with a trailing edge of the input clock signal to produce a first latched signal from a first data output terminal thereof. The second latch circuit has a second data input terminal supplied with the input data signal and a second clock input terminal supplied with the input clock signal. The second latch circuit latches the input data signal in synchronism with a leading edge of the input clock signal to produce, as an output data signal, a second latched signal from a second data output terminal thereof. The third latch circuit has a third data input terminal supplied with the first latched signal and a third clock input terminal supplied with the second latched signal (or the output data signal). The third latch circuit latches the first latched signal in synchronism with a leading edge of the second latched signal (or the output data signal) to produce, as an output up/down signal, a third latched signal from a third data output terminal thereof.

That is, the conventional phase comparator of the type described compares a phase of the leading edge of the input data signal with a phase of the trailing edge of the input clock signal to produce the output up/down signal indicative of a phase difference between the input data signal and the input clock signal. In other words, the output up/down signal indicates one of lag and lead phases which the input clock signal has in comparison with the input data signal. When the input clock signal has the lag phase in comparison with the input data signal, the conventional phase comparator produces, as the output up/down signal, a signal having a logic "1" level indicative of an "up" state. When the input clock signal has the lead phase in comparison with the input data signal, the conventional phase comparator produces, as the output up/down signal, a signal having a logic "0" level indicative of a "down" state.

Inasmuch as the conventional phase comparator has structure where only one of phase difference related to the leading edge of the input data signal is reflected to a comparison result, it results in decreasing a phase margin on carrying out a clock recovery and it is difficult to obtain a sufficient noise-resistance for jitter variation, in the manner which will later be described in conjunction with FIGS. 5A through 5D.

Various other phase comparators of the type are already known. By way of example, a digital PLL (phase-locked loop) circuit is disclosed in U.S. Pat. No. 6,236,696 issued to Yasushi Aoki et al. According to Aoki et al, the digital PLL circuit includes a phase comparing section composed of N phase comparators each of which comprises a flip-flop circuit. The flop-flop circuit has a data input terminal supplied with a sampled data and a clock input terminal supplied with a selected clock signal.

Japanese Unexamined Patent Publication of Tokkai No. 2000-68,991 or JP-A 2000-68991 discloses a clock recovery circuit which attains identification and regeneration of clock data without requirement of a high speed circuit. According to JP-A 2000-68991, the clock recovery circuit includes a phase comparator for detecting a phase difference between an input signal and a voltage controlled signal (a clock signal) supplied from a VCO (voltage controlled oscillator). The phase comparator comprises first and second D-type flip-flops, first and second AND gates, a delay circuit, and an adder. The first D-type flip-flop latches a data signal in synchronism with the clock signal to produce a first non-inverted latched signal and a first inverted latched signal. The first AND gate ANDs the data signal and the first inverted latched signal to produce a first ANDed signal. The second D-type flip-flop latches the first non-inverted latched signal in synchronism with an inverted clock signal to produce a second non-inverted latched signal and a second inverted latched signal. The second non-inverted latched signal is produced as a data output signal. The delay circuit delays the second inverted latched signal to produce a delayed signal. The second AND gate ANDs the first non-inverted latched signal and the delayed signal to produce a second ANDed signal. The adder adds the first ANDed rate, by using the AND gates, a phase difference detection is carried out only at leading edge or trailing edge of the clock signal.

An error-suppressing phase comparator is disclosed in U.S. Pat. No. 6,249,188 issued to Yoshiaki Kaneko. According to Kaneko, the error-suppressing phase comparator includes a phase comparator. When an edge of a recovered clock signal leads an edge of a data signal, the phase comparator produces a pulse of a down signal in order to delay the lead. When the edge of the recovered clock signal lags the edge of the data signal, the phase comparator produces a pulse of an up signal in order to advance the lag. At any rate, the phase comparator generates the pulse of the up signal or the down signal depending on lead or lag of a trailing edge of the recovered clock signal.

SUMMARY OF THE INVENTION

It is an object of this invention to provide a phase comparator which is capable of suitably carrying out a clock recovery.

Other objects of this invention will become clear as the description proceeds.

According to a first aspect of this invention, a phase comparator comprises a flip-flop circuit supplied with an input data signal and an input clock signal and a logic circuit connected to said flip-flop circuit. The flip-flop circuit compares the input clock signal with a leading edge and a trailing edge of the input data signal to produce a leading phase comparison result signal indicative of a leading phase comparison result related to the leading edge of the input data signal and a trailing phase comparison result signal indicative of a trailing phase comparison result related to the trailing edge of the input data signal. The logic circuit produces an output up signal when both of the leading and the trailing phase comparison result signals indicate a lag phase of the input clock signal. The logic circuit produces an output down signal when both of the leading and the trailing phase comparison result signals indicate a lead phase of the input clock signal.

According to a second aspect of this invention, a phase comparator comprises first through N-th flip-flop circuits supplied with an input data signal having a bit rate of X [bps], where N represents a positive integer which is not less than two and a logic circuit connected to the first through the N-th flip-flop circuits. The first through the N-th flip-flop circuits are supplied with first through N-th divided input clock signals, respectively. Each of the first through the N-th flip-flop circuits has a divided clock frequency of X/N [Hz]. Each of the first through the N-th divided input clock signals has leading and trailing edges which coincide with leading and trailing edges of an original input clock signal having an original clock frequency of X [Hz]. The first through the N-th divided input clock signals are phase shifted to one another by an angle of 360/N degrees. An n-th flip-flop circuit compares an n-th divided input clock signal with a leading edge and a trailing edge of the input data signal to produce an n-th leading phase comparison result signal indicative of an n-th leading phase comparison result related to the leading edge of the input data signal and an n-th trailing phase comparison result signal indicative of an n-th trailing phase comparison result related to the trailing edge of the input data signal, where n represents a variable between 1 and N. The logic circuit produces an output up signal when all of the first through the N-th leading phase comparison result signals have a lag phase of the first through the N-th divided input clock signals and when any one of the first through the N-th trailing phase comparison result signals has a lag phase of the first through the N-th divided input clock signals. The logic circuit produces an output down signal when all of the first through the N-th trailing phase comparison result signals have a lead phase of the first through the N-th divided input clock signals and when any one of the first through the N-th leading phase comparison result signals has a lead phase of the first through the N-th divided input clock signals.

BRIEF DESCRIPTION OF THE DRAWING

FIG. 1 is a block diagram of a conventional phase comparator;

FIGS. 2A through 2C are time charts for use in describing operation of the conventional phase comparator illustrated in FIG. 1 in a state where an input clock signal lags an input data signal;

FIGS. 3A through 3C are time charts for use in describing operation of the conventional phase comparator in a state where an input clock signal leads an input data signal;

FIGS. 5A through 5D collectively show a state where the presence probability distribution in the leading edges of the input data signal does not coincide with the presence probability distribution in the trailing edges of the input data signal;

FIGS. 7A through 7D are time charts for use in describing operation of the phase comparator illustrated in FIG. 6 in a state where an input clock signal lags an input data signal;

FIGS. 8A through 8D are time charts for use in describing operation of the phase comparator illustrated in FIG. 6 in a state where the input clock signal leads the input data signal;

FIGS. 9A through 9D are time charts for use in describing operation of the phase comparator illustrated in FIG. 6 in a state where the input clock signal lags and leads the input data signal;

DESCRIPTION OF THE PREFERRED EMBODIMENTS

Figures 4A, 4B, 4C, 4D:
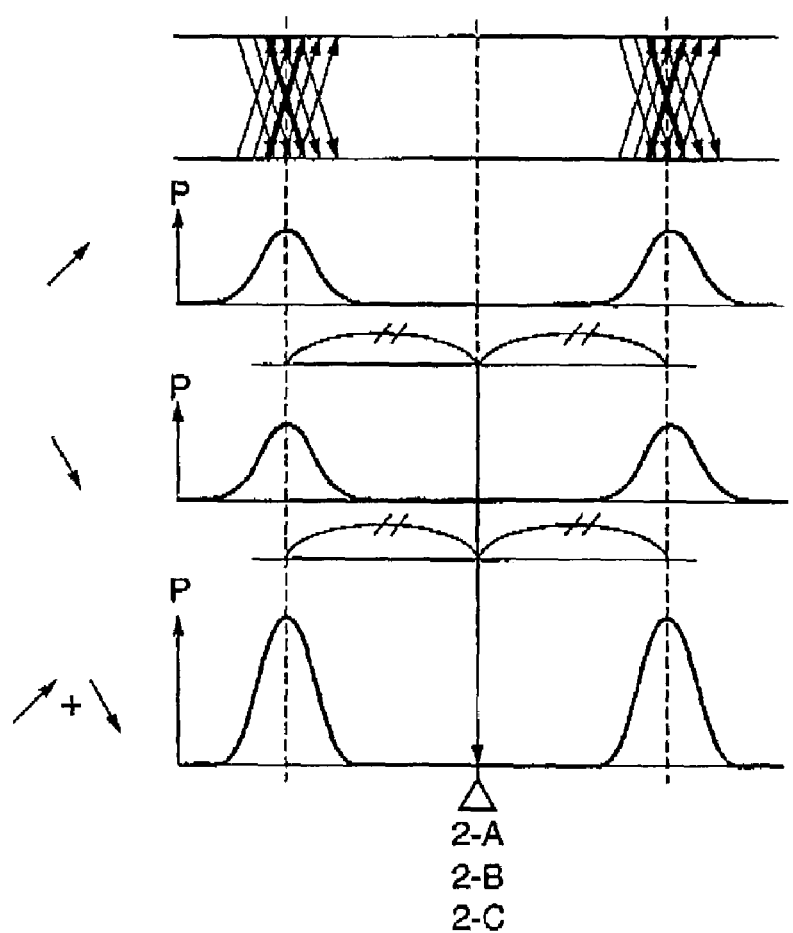
FIGS. 4A through 4D collectively show a state where the presence probability distribution in leading edges of the input data signal substantially coincides with the presence probability distribution in trailing edges of the input data signal.

Referring to FIG. 1, a conventional phase comparator will be described at first in order to facilitate an understanding of the present invention.

The phase comparator comprises a flip-flop circuit 10' consisting of first through third D-type flip-flops 11, 12, and 13. The flip-flop circuit 10' is supplied with an input data signal $D_{IN}$ having a digital signal format and an input clock signal $CLK_{IN}$ for use in data extraction. The input data signal $D_{IN}$ is a received data signal. The first through the third D-type flip-flops 11 to 13 are called first through third latch circuits, respectively. Each of the first through the third latch circuits 11 to 13 has a data input terminal, a clock input terminal, and a data output terminal. The first latch circuit 11 carries out a latch operation in synchronism with a trailing edge of a signal supplied to the clock input terminal thereof while each of the second and the third latch circuits 12 and 13 carries out a latch operation in synchronism with a leading edge of a signal supplied to the clock terminal thereof.

The first latch circuit 11 has a first data input terminal 11$a$ supplied with the input data signal $D_{IN}$ and a first clock input terminal 11$b$ supplied with the input clock signal $CLK_{IN}$. The first latch circuit 11 latches the input data signal $D_{IN}$ in synchronism with a trailing edge of the input clock signal $CLK_{IN}$ to produce a first latched signal from a first data output terminal 11c thereof. The second latch circuit 12 has a second data input terminal 12a supplied with the input data signal $D_{IN}$ and a second clock input terminal 12b supplied with the input clock signal $CIK_{IN}$. The second latch circuit 12 latches the input data signal $D_{IN}$ in synchronism with a leading edge of the input clock signal $CLK_{IN}$ to produce, as an output data signal $D_{OUT}$, a second latched signal from a second data output terminal 12c thereof. The third latch circuit 13 has a third data input terminal 13a supplied with the first latched signal and a third clock input terminal 13b supplied with the second latched signal (or the output data signal $D_{OUT}$). The third latch circuit 13 latches the first latched signal in synchronism with a leading edge of the second latched signal (or the output data signal $D_{OUT}$) to produce, as an output up/down signal $u/d_{out}$, a third latched signal from a third data output terminal 13c thereof.

That is, the conventional phase comparator compares a phase of the leading edge of the input data signal $D_{IN}$ with a phase of the trailing edge of the input clock signal $CLK_{IN}$ to produce the output up/down signal $u/d_{OUT}$ indicative of a phase difference between the input data signal $D_{IN}$ and the input clock signal $CLK_{IN}$. In other words, the output up/down signal $u/d_{OUT}$ indicates one of lag and lead phases which the input clock signal $CLK_{IN}$ has in comparison with the input data signal $D_{IN}$. When the input clock signal $CLK_{IN}$ has the lag phase in comparison with the input data signal $D_{IN}$, the conventional phase comparator produces, as the output up/down signal $U/d_{OUT}$, a signal having a logic "1" level indicative of an "up" state. When the input clock signal $CLK_{IN}$ has the lead phase in comparison with the input data signal $D_{IN}$, the conventional phase comparator produces, as the output up/down signal $u/d_{OUT}$, a signal having a logic "0" level indicative of a "down" state.

It is assumed that the phase comparator is applied to a clock data recovery (CDR) circuit and a lock-in operation completes in the CDR circuit. In this event, the leading edge of the input data signal $D_{IN}$ coincides with the trailing edge of the input clock signal $CLK_{IN}$. The second latch circuit 12 produces the output data signal $D_{OUT}$ indicative of recovered data where a re-timing is made at a phase apart from the leading edge of the input data signal $D_{IN}$ by a half period of the input clock signal $CLK_{IN}$.

Turning to FIGS. 2A through 2C and 3A through 3C, description will be made as regards operation of the phase comparator illustrated in FIG. 1. FIGS. 2A through 2C collectively show a state where the input clock signal $CLK_{IN}$ lags the input data signal $D_{IN}$ while FIGS. 3A through 3C collectively show a state where the input clock signal $CLK_{IN}$ leads the input data signal $D_{IN}$. FIG. 2A shows a waveform of the input data signal $D_{IN}$, FIG. 2B shows a waveform of the input clock signal $CLK_{IN}$, and FIG. 2C shows a waveform of the output up/down signal $u/d_{OUT}$. Likewise, FIG. 3A shows a waveform of the input data signal $D_{IN}$, FIG. 3B shows a waveform of the input clock signal $CLK_{IN}$, and FIG. 3C shows a waveform of the output up/down signal $u/d_{OUT}$.

It will be assumed that the input clock signal $CLK_{IN}$ lags the input data signal $D_{IN}$ as shown in FIGS. 2A and 2B. In this event, the phase comparator produces the output up/down signal $u/d_{OUT}$ having the logic "1" level indicative of the "up" state or a forward state as shown in FIG. 2C.

It will be assumed that input clock signal $CLK_{IN}$ leads the input data signal $D_{IN}$ as shown in FIGS. 3A and 3B. In this event, the phase comparator produces the output up/down signal $u/d_{OUT}$ having the logic "0" level indicative of the "down" state or a delay state as shown in FIG. 3C.

In the manner which is described above, the conventional phase comparator has structure where only one of phase difference related to the leading edge of the input data signal $D_{IN}$ is reflected to a comparison result.

Turning to FIGS. 4A through 4D and 5A through 5D, description will be made as regards presence probability distribution in the leading edges and the trailing edges of the input data signal $D_{IN}$.

FIGS. 4A through 4D collectively show a state where the presence probability distribution in the leading edges of the input data signal $D_{IN}$ substantially coincides with the presence probability distribution in the trailing edges of the input data signal $D_{IN}$. FIG. 4A shows the leading edges and the trailing edges of the input data signal $D_{IN}$. FIG. 4B shows the presence probability distribution in the leading edges of the input data signal $D_{IN}$ while FIG. 4C shows the presence probability distribution in the trailing edges of the input data signal $D_{IN}$. FIG. 4D shows the presence probability distribution in both of the leading edges and the trailing edges of the input data signal $D_{IN}$.

It will be assumed that the presence probability distribution in the leading edges of the input data signal $D_{IN}$ substantially coincides with the presence probability distribution in the trailing edges of the input data signal $D_{IN}$ as shown in FIGS. 4B and 4C. In this event, a phase 2-A or 2-B apart from the leading edge or the trailing edge of the input data signal $D_{IN}$ by a half period thereof coincides with an ideal phase 2-C on re-timing the recovery data, as shown in FIGS. 4B through 4D.

FIGS. 5A through 5D collectively show a state where the presence probability distribution in the leading edges of the input data signal $D_{IN}$ does not coincide with the presence probability distribution in the trailing edges of the input data signal $D_{IN}$. FIG. 5A shows the leading edges and the trailing edges of the input data signal $D_{IN}$. FIG. 5B shows the presence probability distribution in the leading edges of the input data signal $D_{IN}$ while FIG. 5C shows the presence probability distribution in the trailing edges of the input data signal $D_{IN}$. FIG. 5D shows the presence probability distribution in both of the leading edges and the trailing edges of the input data signal $D_{IN}$.

It will be assumed that the presence probability distribution in the leading edges of the input data signal $D_{IN}$ does not coincide with the presence probability distribution in the trailing edges of the input data signal $D_{IN}$ as shown in FIGS. 5B and 5C. In this event, phases 3-A and 3-B apart from the leading edge and the trailing edge of the input data signal $D_{IN}$ by a half period thereof do not coincide with an ideal phase 3-C on re-timing the recovery data, as shown in FIGS. 5B through 5D.

Therefore, it results in decreasing a phase margin on carrying out a clock recovery and it is difficult to obtain a sufficient noise-resistance for jitter variation of the input data signal $D_{IN}$ when the phase comparator is applied to the CDR circuit, as mentioned in the preamble of the instant specification.

Figure 6:
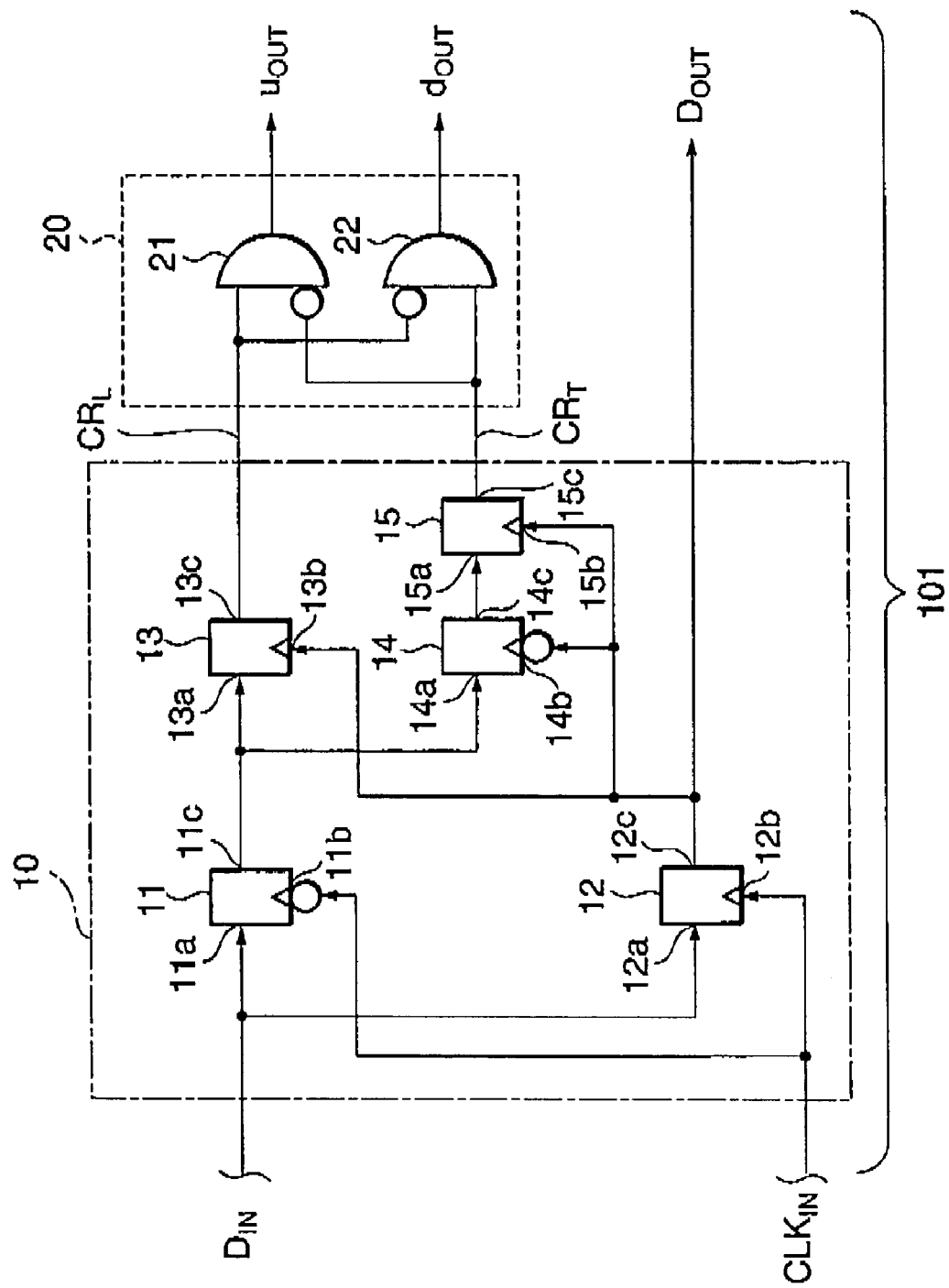
FIG. 6 is a block diagram of a phase comparator according to a first embodiment of this invention.

Referring to FIG. 6, the description will proceed to a phase comparator 101 according to a first embodiment of this invention. The illustrated phase comparator 101 comprises a flip-flop circuit 10 and a logic circuit 20.

The flip-flop circuit 10 is supplied with the input data signal $D_{IN}$ and the input clock signal $CLK_{IN}$. The flip-flop circuit 10 compares the input clock signal $CLK_{IN}$ with a leading edge and a trailing edge of the input data signal $D_{IN}$ to produce a leading phase comparison result signal $CR_L$ indicative of a leading phase comparison result related to the leading edge of the input data signal $D_{IN}$ and a trailing phase comparison result signal $CR_T$ indicative of a trailing phase comparison result related to the trailing edge of the input data signal $D_{IN}$.

The logic circuit 20 is connected to the flip-flop circuit 10. The logic circuit 20 produces an output up signal $u_{OUT}$ when both of the leading and the trailing phase comparison result signals indicate a lag phase of the input clock signal $CLK_{IN}$. The logic circuit 20 produces an output down signal $d_{OUT}$ when both of the leading and the trailing phase comparison result signals indicate a lead phase of the input clock signal $CLK_{IN}$.

More specifically, the flip-flop circuit 10 consists of first through fifth D-type flip-flops 11, 12, 13, 14, and 15. The first through the fifth D-type flip-flops 11 to 15 are called first through fifth latch circuits, respectively.

The first latch circuit 11 has a first data input terminal 11a supplied with the input data signal $D_{IN}$ and a first clock input terminal 11b supplied with the input clock signal $CLK_{IN}$. The first latch circuit 11 latches the input data signal $D_{IN}$ in synchronism with a trailing edge of the input clock signal $CLK_{IN}$ to produce a first latched signal from a first data output terminal 11c thereof.

The second latch circuit 12 has a second data input terminal 12a supplied with the input data signal $D_{IN}$ and a second clock input terminal 12b supplied with the input clock signal $CLK_{IN}$. The second latch circuit 12 latches the input data signal $D_{IN}$ in synchronism with a leading edge of the input clock signal $CLK_{IN}$ to produce a second latched signal as an output data signal $D_{OUT}$ from a second data output terminal 12c thereof.

The third latch circuit 13 has a third data input terminal 13a supplied with the first latched signal and a third clock input terminal 13b supplied with the second latched signal (or the output data signal $D_{OUT}$). The third latch circuit 13 latches the first latched signal in synchronism with a leading edge of the second latched signal (or the output data signal $D_{OUT}$) to produce a third latched signal as the leading phase comparison result signal $CR_L$ from a third data output terminal 13c thereof.

The fourth latch circuit 14 has a fourth data input terminal 14a supplied with the first latched signal and a fourth clock input terminal 13b supplied with the second latched signal (or the output data signal $D_{OUT}$). The fourth latch circuit 14 latches the first latched signal in synchronism with a trailing edge of the second latched signal (or the output data signal $D_{OUT}$) to produce a fourth latched signal from a fourth data output terminal 14c thereof.

The fifth latch circuit 15 has a fifth data input terminal 15a supplied with the fourth latched signal and a fifth clock input terminal 15b supplied with the second latched signal (or the output data signal $D_{OUT}$). The fifth latch circuit 15 latches the fourth latched signal in synchronism with a leading edge of the second latched signal (or the output data signal $D_{OUT}$) to produce a fifth latched signal as the trailing phase comparison result signal $CR_T$ from a fifth data output terminal 15c thereof.

In the example being illustrated, the leading phase comparison result signal $CR_L$ has a logic "1" level when the leading phase comparison result signal $CR_L$ indicates the lag phase of the input clock signal $CLK_{IN}$. The leading phase comparison result signal $CR_L$ has a logic "0" level when the leading phase comparison result signal $CR_L$ indicates the lead phase of the input clock signal $CLK_{IN}$. The trailing phase comparison result signal $CR_T$ has the logic "1" level when the trailing phase comparison result signal $CR_T$ indicates the lead phase of the input clock signal $CLK_{IN}$. The trailing phase comparison result signal $CR_T$ has the logic "0" level when the trailing phase comparison result signal $CR_T$ indicates the lag phase of the input clock signal $CLK_{IN}$.

The logic circuit 20 comprises first and second AND gates 21 and 22.

The first AND gate 21 is supplied with the leading phase comparison result signal $CR_L$ and an inverted trailing phase comparison result signal obtained by inverting the trailing phase comparison result signal $CR_T$. The first AND gate 21 ANDs the leading phase comparison result signal $CR_L$ and the inverted trailing phase comparison result signal to produce a first ANDed signal as the output up signal $u_{OUT}$.

The second AND gate 22 is supplied with the trailing phase comparison result signal $CR_T$ and an inverted leading phase comparison result signal obtained by inverting the leading phase comparison result signal $CR_L$. The second AND gate 22 ANDs the trailing phase comparison result signal $CR_T$ and the inverted leading phase comparison result signal to produce a second ANDed signal as the output down signal $d_{OUT}$.

Turning to FIGS. 7A through 7D, 8A through 8D, and 9A through 9D, description will be made as regards operation of the phase comparator 101 illustrated in FIG. 6. FIGS. 7A through 7D collectively show a state where the input clock signal $CLK_{IN}$ lags the input data signal $D_{IN}$. FIGS. 8A through 8D collectively show a state where the input clock signal $CLK_{IN}$ leads the input data signal $D_{IN}$. FIGS. 9A through 9D collectively show a state where the input clock signal $CLK_{IN}$ lags and leads the input data signal $D_{IN}$.

FIG. 7A shows a waveform of the input data signal $D_{IN}$, FIG. 7B shows a waveform of the input clock signal $CLK_{IN}$, FIG. 7C shows a waveform of the output up signal $u_{OUT}$, and FIG. 7D shows a waveform of the output down signal $d_{OUT}$. Likewise, FIG. 8A shows a waveform of the input data signal $D_{IN}$, FIG. 8B shows a waveform of the input clock signal $CLK_{IN}$, FIG. 8C shows a waveform of the output up signal $u_{OUT}$, and FIG. 8D shows a waveform of the output down signal $d_{OUT}$. FIG. 9A shows a waveform of the input data signal $D_{IN}$, FIG. 9B shows a waveform of the input clock signal $CLK_{IN}$, FIG. 9C shows a waveform of the output up signal $u_{OUT}$, and FIG. 9D shows a waveform of the output down signal $d_{OUT}$.

It will be assumed that the input clock signal $CLK_{IN}$ lags the input data signal $D_{IN}$ as shown in FIGS. 7A and 7B. In this event, the phase comparator 101 produces the output up signal $u_{OUT}$ having the logic "1" level indicative of the "up" state or a forward state as shown in FIG. 7C. Under the circumstances, the output down signal $d_{OUT}$ has the logic "0" level as shown in FIG. 7D.

It will be assumed that the input clock signal $CLK_{IN}$ leads the input data signal $D_{IN}$ as shown in FIGS. 8A and 8B. In this event, the phase comparator 101 produces the output down signal $d_{OUT}$ having the logic "1" level indicative of the "down" state or a delay state as shown in FIG. 8D. Under the circumstances, the output up signal $u_{OUT}$ has the logic "0" level as shown in FIG. 8C.

It will be assumed that the input clock signal $CLK_{IN}$ lags and leads the input data signal $D_{IN}$ as shown in FIGS. 9A and 9B. In this event, the phase comparator 101 produces the output up signal $u_{OUT}$ having the logic "0" level and the output down signal $d_{OUT}$ having the logic "0" level as shown in FIGS. 9C and 9D. That is, no phase control is carried out.

With this structure, it is possible to maximize a phase margin on carrying out a clock recovery without distortion in a duty ratio of the input data signal $D_{IN}$. It is possible to obtain a sufficient noise-resistance for jitter variation of the input data signal $D_{IN}$ when the phase comparator 101 is applied to the CDR circuit. Accordingly, it is possible to suitably carry out recovery of a clock and data.

In addition, it is possible to control an analog integrator by differentiating the output up signal $u_{OUT}$ and the output down signal $d_{OUT}$ to a necessary pulse width. It is possible to control a digital integrator composed of a digital counter or the like by using the output data signal $D_{OUT}$ as a clock signal.

Figure 10:
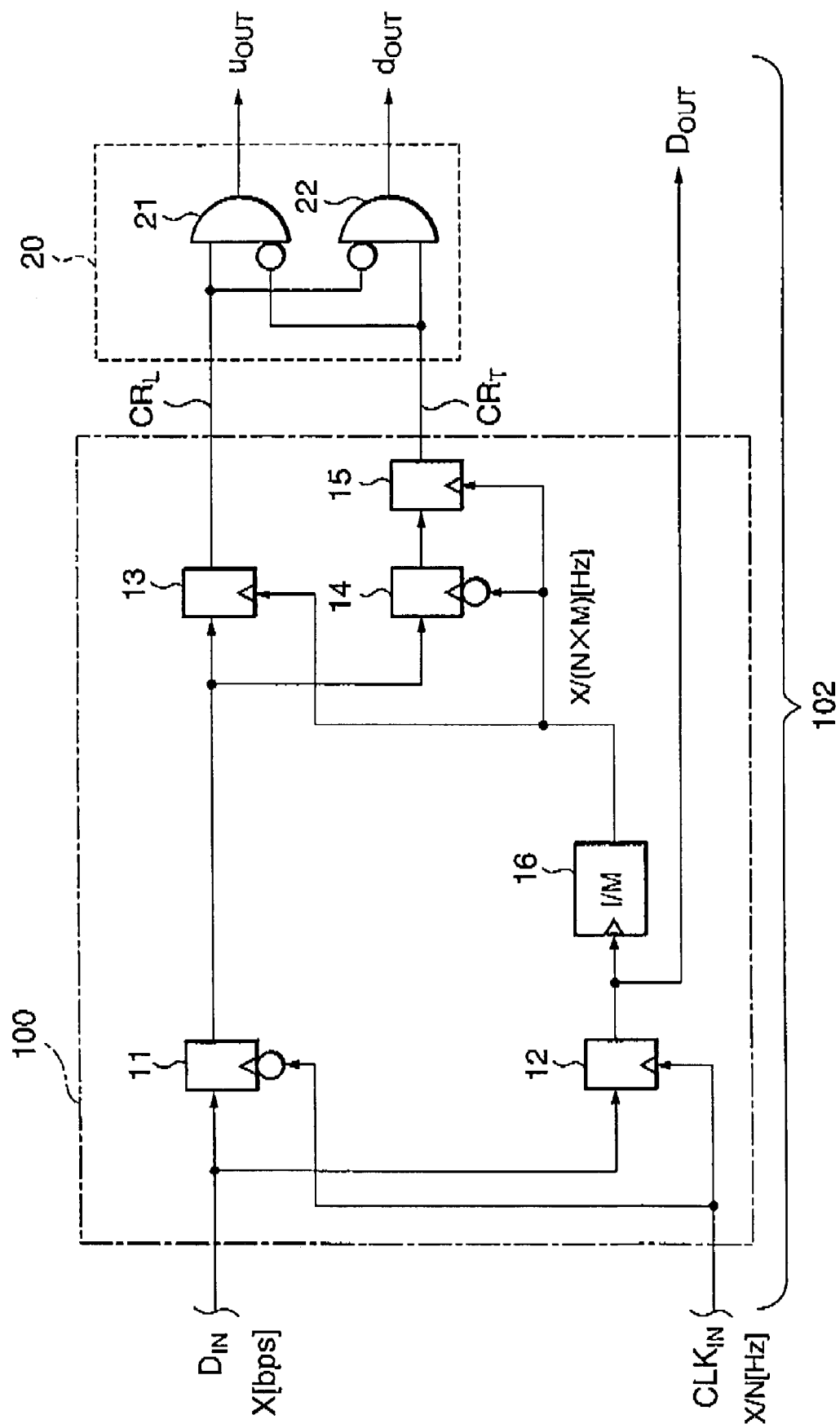
FIG. 10 is a block diagram of a phase comparator according to a second embodiment of this invention.

Referring to FIG. 10, the description will proceed to a phase comparator 102 according to a second embodiment of this invention. The phase comparator 102 is similar in structure and operation to the phase comparator 101 illustrated in FIG. 6 except that the flip-flop circuit is modified from that illustrated in FIG. 6 as will later become clear. The flip-flop circuit is therefore depicted at 100.

The flip-flop circuit 100 comprises an M frequency divider 16 as well as the first through the fifth latch circuits 11 to 15, where M represents a positive integer. The M frequency divider 16 is connected to the second latch circuit 12.

Figure 11:
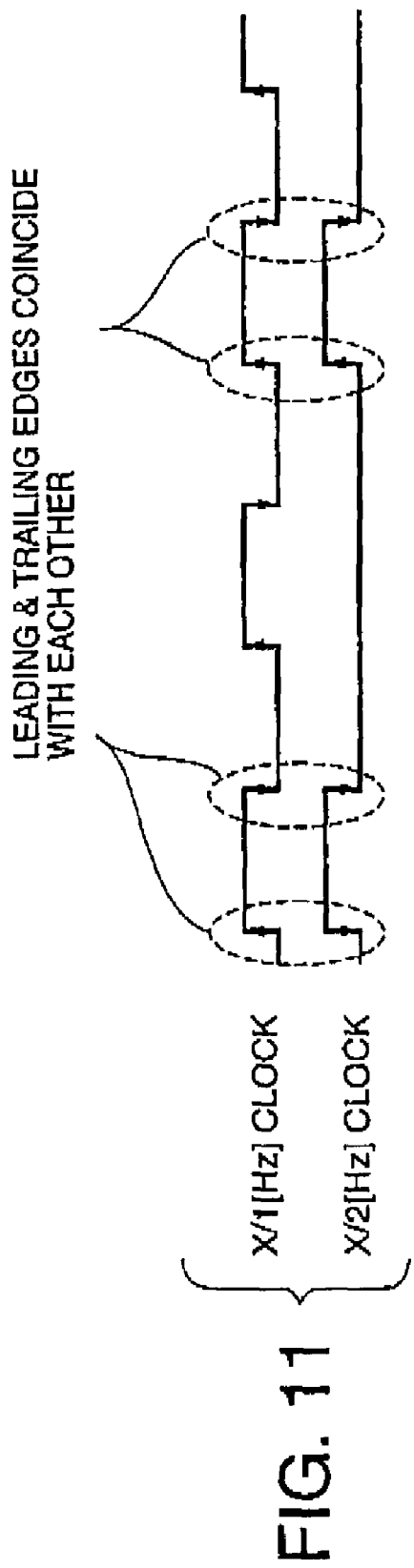
FIG. 11 is time charts of an input clock signal for use in the phase comparator illustrated in FIG. 10.

In the example being illustrated, the input data signal $D_{IN}$ has a data rate of X [bps]. The input clock signal $CLK_{IN}$ has a clock frequency of X/N [Hz], where N represents a natural number that is greater than or equal to two, and has leading and trailing edges which coincide with leading and trailing edges of an input clock signal having the clock frequency of X [Hz], as shown in FIG. 11.

The first latch circuit 11 latches the input data signal $D_{IN}$ in synchronism with a trailing edge of the input clock signal $CLK_{IN}$ to produce a first latched signal. The second latch circuit 12 latches the input data signal $D_{IN}$ in synchronism with a leading edge of the input clock signal $CLK_{IN}$ to produce a second latched signal as an output data signal $D_{OUT}$. The M frequency divider 16 frequency divides the second latched signal (or the output data signal $D_{OUT}$) on the basis of a dividing number M to produce a divided second latched signal having a divided frequency of X/(N×M), where M represents a positive integer. In other words, the M frequency divider 16 is for frequency dividing the output data signal $D_{OUT}$ by a factor 1/M.

The third latch circuit 13 latches the first latched signal in synchronism with a leading edge of the divided second latched signal to produce a third latched signal as the leading phase comparison result signal $CR_L$. The fourth latch circuit 14 latches the first latched signal in synchronism with a trailing edge of the divided second latched signal to produce a fourth latched signal. The fifth latch circuit 15 latches the fourth latched signal in synchronism with a leading edge of the divided second latched signal to produce a fifth latched signal as the trailing phase comparison result signal $CR_T$.

With this structure, it is possible to vary a period of the output up signal $u_{OUT}$ and the output down signal $d_{OUT}$.

Figure 12:
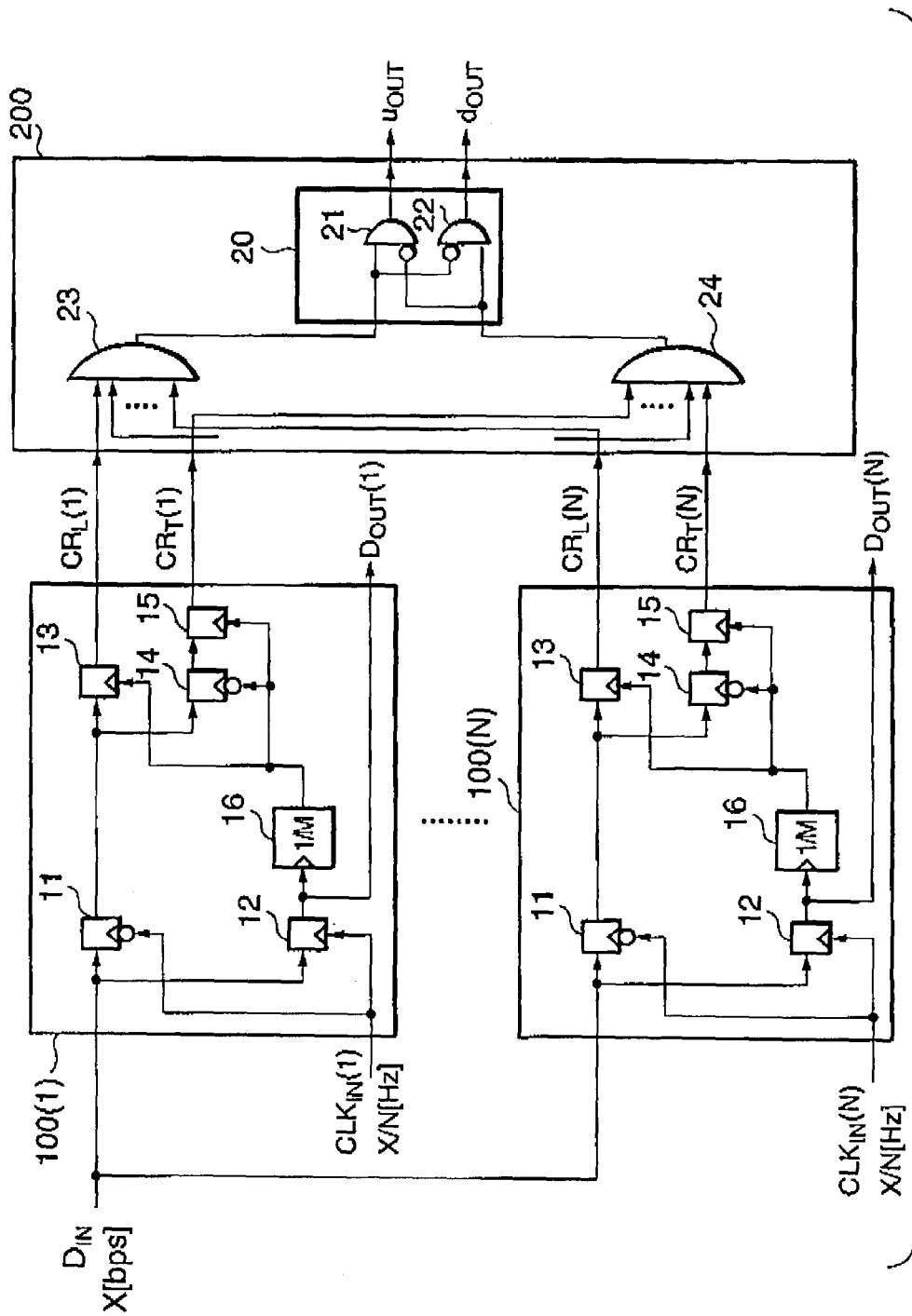
FIG. 12 is a block diagram of a phase comparator according to a third embodiment of this invention.

Referring to FIG. 12, the description will proceed to a phase comparator 103 according to a third embodiment of this invention. The phase comparator 103 comprises first through N-th flip-flop circuits 100(1) through 100(N) and a logic circuit 200, where N represents a positive integer which is not less than two.

The first through the N-th flip-flop circuits 100(1) through 100(N) are supplied with an input data signal $D_{IN}$ having a bit rate of X [bps]. The first through the N-th flip-flop circuits 100(1) through 100(N) are supplied with first through N-th divided input clock signals $CLK_{IN}(1)$ through $CLK_{IN}(N)$, respectively. Each of the first through the N-th divided input clock signals $CLK_{IN}(1)$ through $CLK_{IN}(N)$ has a divided clock frequency of X/N [Hz].

Figure 13:
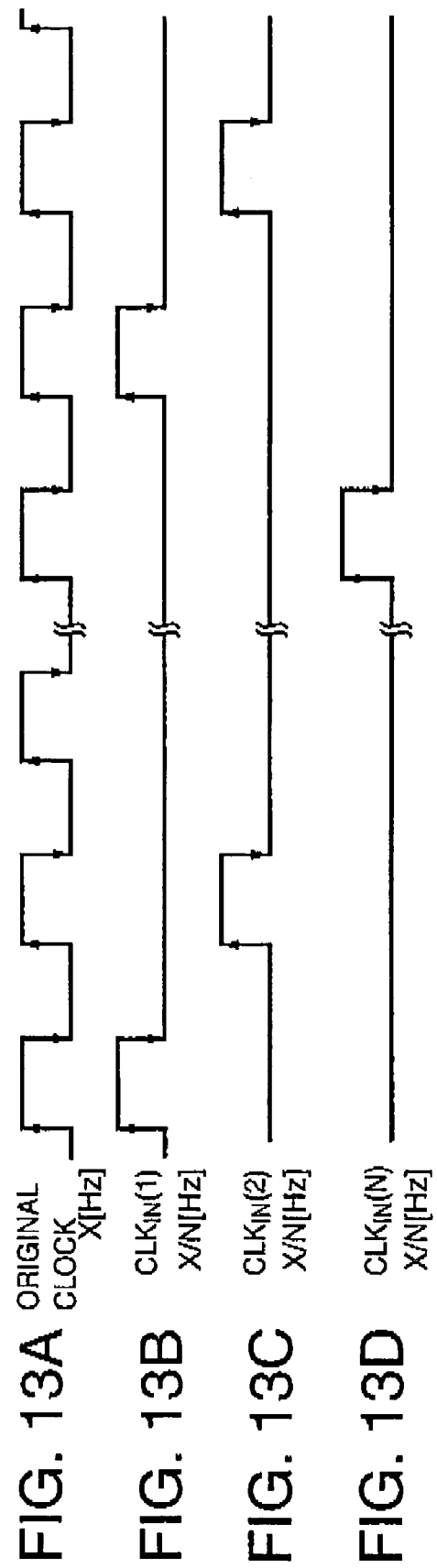
FIGS. 13A through 13D are time charts of first through N-th divided input clock signals for use in the phase comparator illustrated in FIG. 12.

FIG. 13A shows a waveform of an original input clock signal having an original clock frequency of X [Hz]. FIGS. 13B, 13C, and 13D show waveforms of the first, the second and the N-th divided input clock signals $CLK_{IN}(1)$, $CLK_{IN}(2)$, and $CLK_{IN}(N)$, respectively.

As apparent from FIGS. 13A through 13D, each of the first through the N-th divided input clock signals $CLK_{IN}(1)$ through $CLK_{IN}(N)$ has leading and trailing edges which coincide with leading and trailing edges of the original input clock signal having the original clock frequency of X [Hz]. The first through the N-th divided input clock signals $CLK_{IN}(1)$ through $CLK_{IN}(N)$ are phase shifted to one another by an angle of 360/N degrees for a period of each divided clock signal.

Turning back to FIG. 12, each of the first through the N-th flip-flop circuits 100(1) through 100(N) is similar in structure and operation to the flip-flop circuit 100 illustrated in FIG. 10. That is, an n-th flip-flop circuit 100(n) comprises the first through the fifth latch circuit 11 through 15 and the M frequency divider 16, where n represents a variable between 1 and N.

The n-th flip-flop circuit 100(n) compares an n-th divided input clock signal $CLK_{IN}(n)$ with a leading edge and a trailing edge of the input data signal $D_{IN}$ to produce an n-th leading phase comparison result signal $CR_L(n)$ indicative of an n-th leading phasae comparison result related to the leading edge of the input data signal $D_{IN}$ and an n-th trailing phase comparison result signal $CR_T(n)$ indicative of an n-th trailing phase comparison result related to the trailing edge of the input data signal $D_{IN}$. The n-th flip-flop circuit 100(n) produces an n-th output data signal $D_{OUT}(n)$.

The logic circuit 200 is connected to the first through the N-th flip-flop circuits 100(1) through 100(N). The logic circuit 200 produces an output up signal $u_{OUT}$ when all of the first through the N-th leading phase comparison result signals $CR_L(1)$ through $CR_L(N)$ indicate a lag phase of the first through the N-th divided input clock signals $CLK_{IN}(1)$ through $CLK_{IN}(N)$ and when any one of the first through the N-th trailing phase comparison result signals $CR_T(1)$ through $CR_T(N)$ indicates a lag phase of the first through the N-th divided input clock signals $CLK_{IN}(1)$ through $CLK_{IN}(N)$. The logic circuit 200 produces an output down signal $d_{OUT}$ when all of the first through the N-th trailing phase comparison result signals $CR_T(1)$ through $CR_T(N)$ indicate a lead phase of the first through the N-th divided input clock signals $CLK_{IN}(1)$ through $CLK_{IN}(N)$ and when any one of the first through the N-th leading phase comparison result signals $CR_L(1)$ through $CR_L(N)$ indicates a lead phase of the first through the N-th divided input clock signals $CLK_{IN}(1)$ through $CLK_{IN}(N)$.

The n-th leading phase comparison result signal $CR_L(n)$ has a logic "1" level when the n-th leading phase comparison result signal $CR_L(n)$ indicates the lag phase of the n-th divided input clock signal $CLK_{IN}(n)$. The n-th leading phase comparison result signal $CR_L(n)$ has a logic "0" level when the n-th leading phase comparison result signal $CR_L(N)$ indicates the lead phase of the n-th divided input clock signal $CLK_{IN}(n)$. The n-th trailing phase comparison result signal $CR_T(n)$ has the logic "1" level when the n-the trailing phase comparison result signal $CR_T(n)$ indicates the lead phase of the n-th divided input clock signal $CLK_{IN}(n)$. The n-th trailing phase comparison result signal $CR_T(n)$ has the logic "0" level when the n-th trailing phase comparison result signal $CR_T(n)$ indicates the lag phase of the n-th divided input clock signal $CLK_{IN}(n)$.

The logic circuit 200 comprises not only the first and the second AND gates 21 and 22 but also third and fourth AND gates 23 and 24.

The third AND gate 23 is supplied with the first through the N-th leading phase comparison result signals $CR_L(1)$ through $CR_L(N)$. The third AND gate 23 ANDs the first through the N-th leading phase comparison result signals $CR_L(1)$ through $CR_L(N)$ to produce an ANDed leading phase comparison result signal. Inasmuch as the third AND gate 23 is supplied with the first through the N-th leading phase comparison result signals $CR_L(1)$ through $CR_L(N)$, the third AND gate 23 is called a leading comparison processing gate and the ANDed leading phase comparison result signal is called a processed leading phase comparison result signal. When all of the first through the N-th leading phase comparison result signals $CR_L(1)$ through $CR_L(N)$ indicate the lag phase of the first through the N-th divided input clock signals $CLK_{IN}(1)$ through $CLK_{IN}(N)$, the leading comparison processing gate 23 produces the processed leading phase comparison result signal having a logic "1" level. When any one of the first through the N-th leading phase comparison result signals $CR_L(1)$ through $CR_L(N)$ indicates the lead phase of the first through the N-th divided input clock signals $CLK_{IN}(1)$ through $CLK_{IN}(N)$, the leading comparison processing gate 23 produces the processed leading phase comparison result signal having the logic "0" level.

The fourth AND gate 24 is supplied with the first through the N-th trailing phase comparison result signals $CR_T(1)$ through $CR_T(N)$. The fourth AND gate 24 ANDs the first through the N-th trailing phase comparison result signals $CR_T(1)$ through $CR_T(N)$ to produce an ANDed trailing phase comparison result signal. Inasmuch as the fourth AND gate 24 is supplied with the first through the N-th trailing phase comparison result signals $CR_T(1)$ through $CR_T(N)$, the fourth AND gate 24 is called a trailing comparison processing gate and the ANDed trailing phase comparison result signal is called a processed trailing phase comparison result signal. When all of the first through the N-th trailing phase comparison result signals $CR_T(1)$ through $CR_T(N)$ indicate the lead phase of the first through the N-th divided input clock signals $CLK_{IN}(1)$ through $CLK_{IN}(N)$, the trailing comparison processing gate 24 produces the processed trailing phase comparison result signal having a logic "1" level. When any one of the first through the N-th trailing phase comparison result signals $CR_T(1)$ through $CR_T(N)$ indicates the lag phase of the first through the N-th divided input clock signals $CLK_{IN}(1)$ through $CLK_{IN}(N)$, the trailing comparison processing gate 24 produces the processed trailing phase comparison result signal having the logic "0" level.

The first AND gate 21 is connected to the leading comparison processing gate 23 and the trailing comparison processing gate 24. The first AND gate 21 is supplied with the processed leading phase comparison result signal and an inverted processed trailing phase comparison result signal obtained by inverting the processed trailing phase comparison result signal. The first AND gate 21 ANDs the processed leading phase comparison result signal and the inverted processed trailing phase comparison result signal to produce a first ANDed signal as the output up signal $u_{OUT}$.

The second AND gate 22 is connected to the leading comparison processing gate 23 and the trailing comparison processing gate 24. The second AND gate 22 is supplied with the processed trailing phase comparison result signal and an inverted processed leading phase comparison result signal obtained by inverting the processed leading phase comparison result signal. The second AND gate 22 ANDs the processed trailing phase comparison result signal and the inverted processed leading phase comparison result signal to produce a second ANDed signal as the output down signal $u_{OUT}$.

Figure 14:
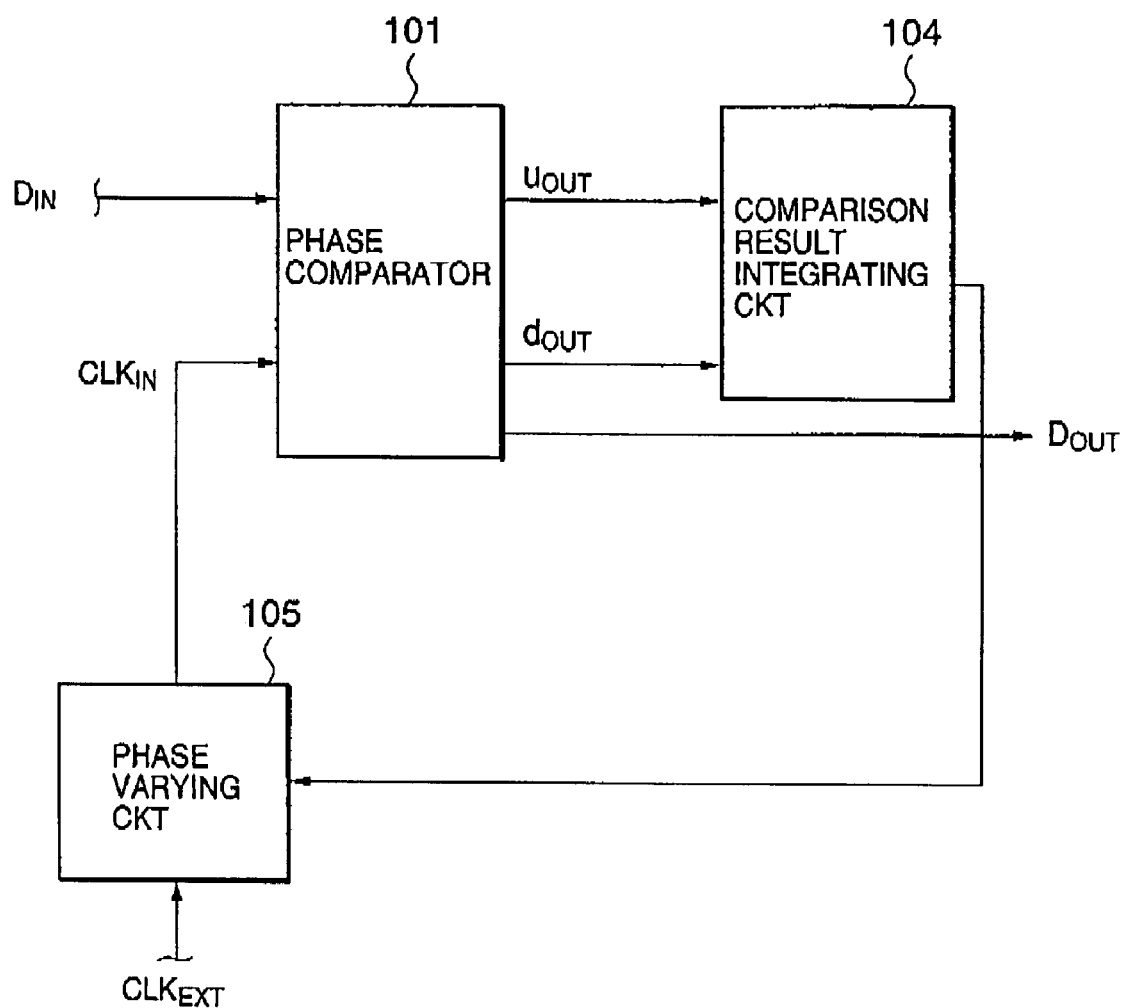
FIG. 14 is a block diagram of a clock data recovery (CDR) circuit to which the phase comparator illustrated in FIG. 6 is applicable.

Referring to FIG. 14, the description will proceed to a clock data recovery (CDR) circuit to which the phase comparator 101 illustrated in FIG. 6 is applicable. The illustrated CDR circuit comprises the phase comparator 101 illustrated in FIG. 1, a comparison result integrating circuit 104, and a phase varying circuit 105.

The comparison result integrating circuit 104 is connected to the phase comparator 101. The comparison result integrating circuit 104 integrates the output up signal $u_{OUT}$ and the output down signal $d_{OUT}$ to produce a control signal. The phase varying circuit 105 is connected to the comparison result integrating circuit 104 and is supplied with an oscillation clock signal $CLK_{EXT}$ from the exterior. The phase varying circuit 105 varies a phase of the oscillation clock signal $CLK_{EXT}$ in response to the control signal to produce the input clock signal $CLK_{IN}$.

Although the oscillation clock signal $CLK_{EXT}$ is supplied to the phase varying circuit 105 from the exterior, the phase varying circuit 105 may include an oscillator for oscillating the oscillation clock signal $CLK_{EXT}$.

Figure 15:
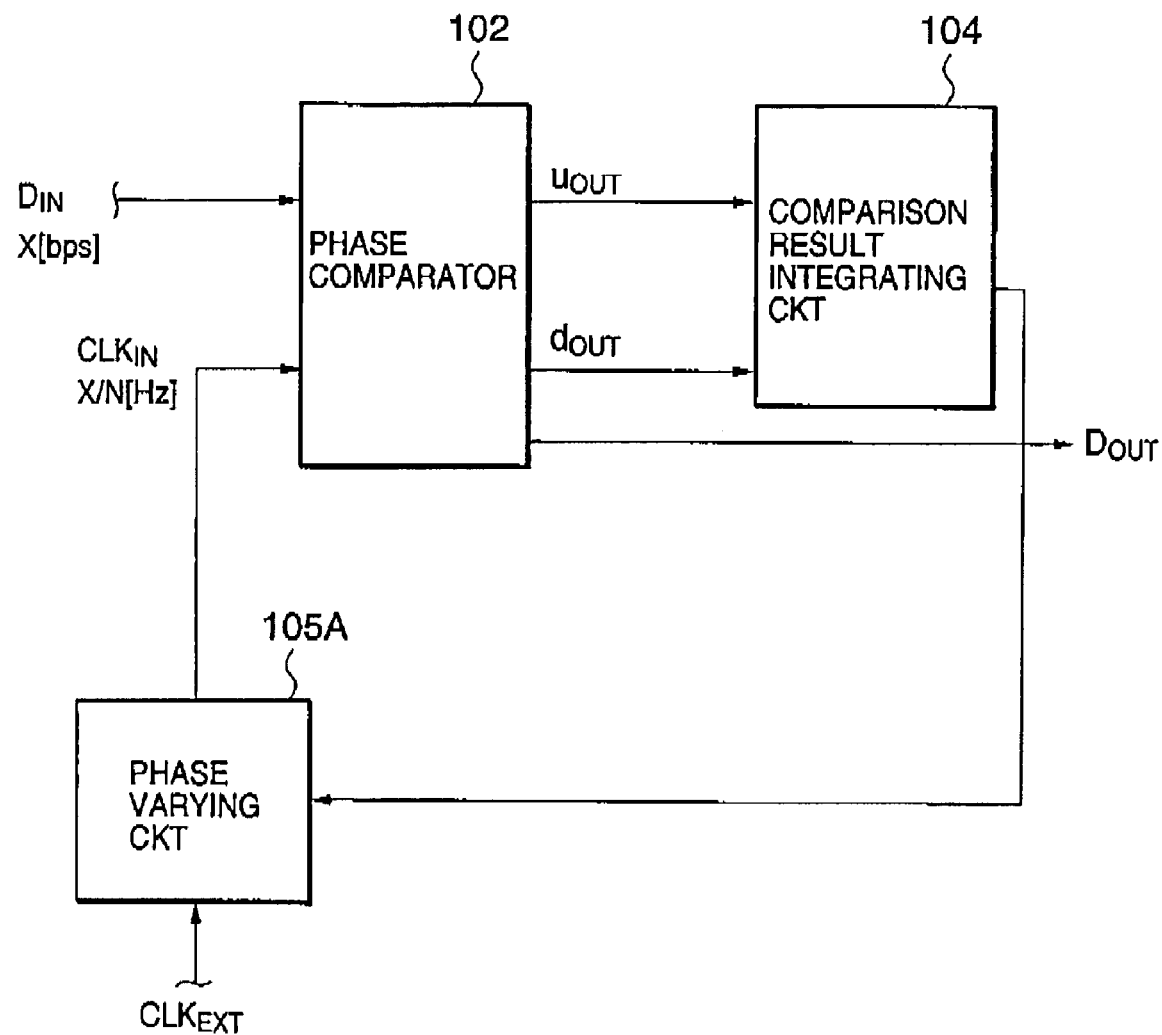
FIG. 15 is a block diagram of another clock data recovery (CDR) circuit to which the phase comparator illustrated in FIG. 10 is applicable.

Referring to FIG. 15, the description will proceed to another CDR circuit to which the phase comparator 102 illustrated in FIG. 10 is applicable. The illustrated CDR circuit is similar in structure and operation to the CDR circuit illustrated in FIG. 14 except that the CDR circuit comprises the phase comparator 102 illustrated in FIG. 10 in lieu of the phase comparator 101 illustrated in FIG. 6 and the phase varying circuit is modified from that illustrated in FIG. 14 as will later become clear. The phase varying circuit is therefore depicted at 105A.

The illustrated phase varying circuit 105A varies a phase of the oscillation clock signal $CLK_{EXT}$ in response to the control signal to produce the input clock signal $CLK_{IN}$ having a clock frequency of X/N [Hz] as shown in FIG. 11.

Figure 16:
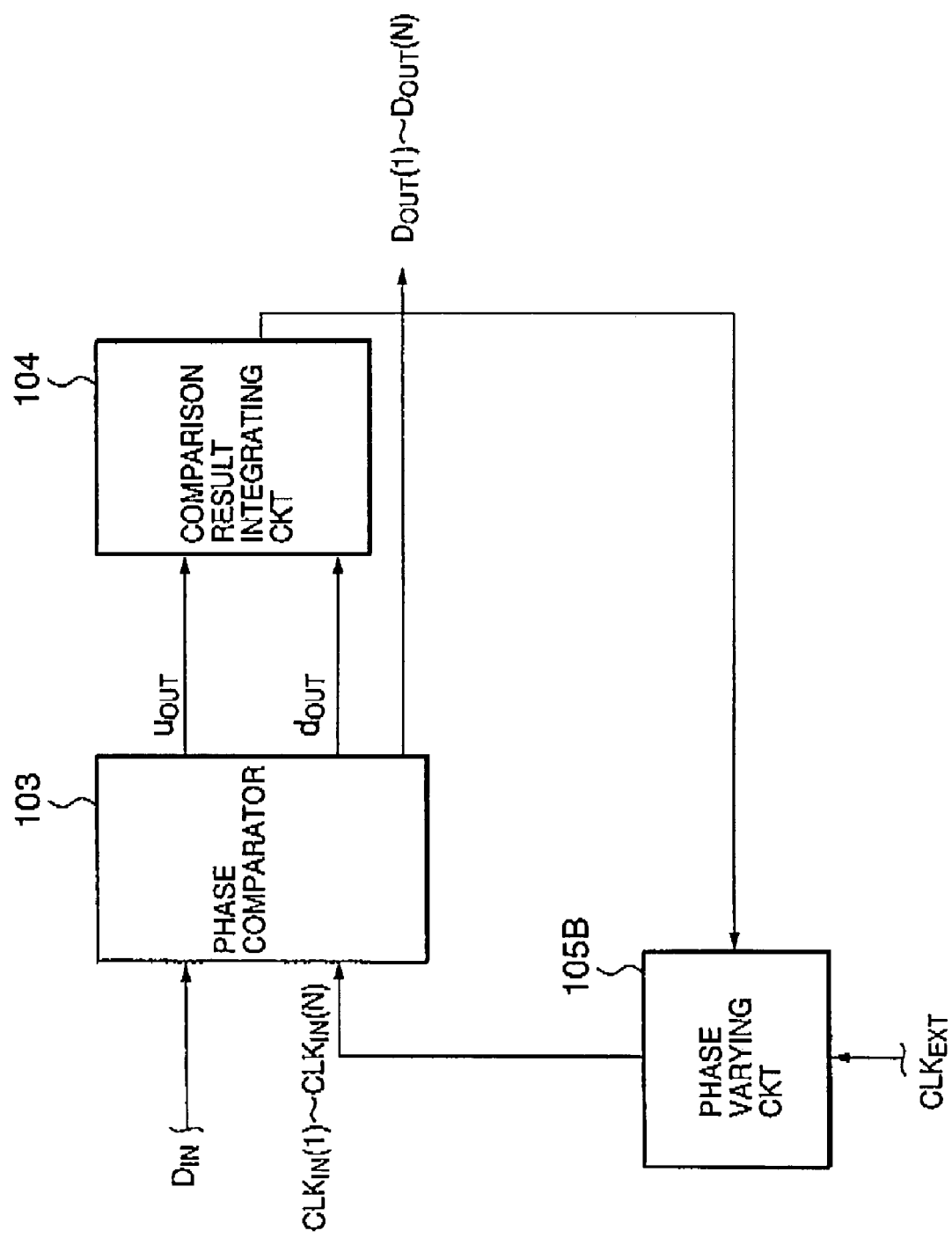
FIG. 16 is a block diagram of still another clock data recovery (CDR) circuit to which the phase comparator illustrated in FIG. 12 is applicable.

Referring to FIG. 16, the description will proceed to still another CDR circuit to which the phase comparator 103 illustrated in FIG. 12 is applicable. The illustrated CDR circuit is similar in structure and operation to the CDR circuit illustrated in FIG. 14 except that the CDR circuit comprises the phase comparator 103 illustrated in FIG. 12 in lieu of the phase comparator 101 illustrated in FIG. 6 and the phase varying circuit is modified from that illustrated in FIG. 14 as will later become clear. The phase varying circuit is therefore depicted at 105B.

The illustrated phase varying circuit 105B varies a phase of the oscillation clock signal $CLK_{EXT}$ in response to the control signal to produce the first through the N-th divided input clock signals $CLK_{IN}(1)$ through $CLK_{IN}(N)$ as shown in FIGS. 13B through 13D.

While this invention has thus far been described in conjunction with a few embodiments thereof, it will readily be possible for those skilled in the art to put this invention into practice in various other manners.

What is claimed is:

1. A phase comparator comprising:
a flip-flop circuit supplied with an input data signal and an input clock signal, said flip-flop circuit comparing said input clock signal with a leading edge and a trailing edge of said input data signal to produce a leading phase comparison result signal indicative of a leading phase comparison result related to said leading edge of said input data signal and a trailing phase comparison result signal indicative of a trailing phase comparison result related to said trailing edge of said input data signal; and a logic circuit connected to said flip-flop circuit, said logic circuit producing an output up signal when both of said leading and said trailing phase comparison result signals indicate a lag phase of the input clock signal, said logic circuit producing an output down signal when both of said leading and said trailing phase comparison result signals indicate a lead phase of said input clock signal, wherein the logic circuit produces the output up signal based on both of said leading and said trailing phase comparison result signals, and wherein the logic circuit produces the output down signal based on both of said leading and said trailing phase comparison result signals.

2. A phase comparator as claimed in claim 1, wherein said flip-flop circuit comprises:

a first latch circuit for latching said input data signal in synchronism with a trailing edge of said input clock signal to produce a first latched signal;

a second latch circuit for latching said input data signal in synchronism with a leading edge of said input clock signal to produce a second latched signal as an output data signal;

a third latch circuit for latching said first latched signal in synchronism with a leading edge of said second latched signal to produce a third latched signal as said leading phase comparison result signal;

a fourth latch circuit for latching said first latched signal in synchronism with a trailing edge of said second latched signal to produce a fourth latched signal; and a fifth latch circuit for latching said fourth latched signal in synchronism with a leading edge of said second latched signal to produce a fifth latched signal as said trailing phase comparison result signal.

3. A phase comparator as claimed in claim 1, wherein said leading phase comparison result signal has a logic "1" level when said leading phase comparison result signal indicates the lag phase of said input clock signal, said leading phase comparison result signal having a logic "0" level when said leading phase comparison result signal indicates the lead phase of said input clock signal, said trailing phase comparison result signal having the logic "1" level when said trailing phase comparison result signal indicates the lead phase of said input clock signal, said trailing phase comparison result signal having the logic "0" level when said trailing phase comparison result signal indicates the lag phase of said input clock signal, said logic circuit comprising:

a first AND gate supplied with said leading phase comparison result signal and an inverted trailing phase comparison result signal obtained by inverting said trailing phase comparison result signal, said first AND gate ANDing said leading phase comparison result signal and said inverted trailing phase comparison result signal to produce a first ANDed signal as said output up signal; and a second AND gate supplied with said trailing phase comparison result signal and an inverted leading phase comparison result signal obtained by inverting said leading phase comparison result signal, said second AND gate ANDs said trailing phase comparison result signal and said inverted leading phase comparison result signal to produce a second ANDed signal as said output down signal.

4. A phase comparator as claimed in claim 1, wherein said input data signal has a data rate of X [bps], said input clock signal having a clock frequency of X/N [Hz], where N represents a natural number that is greater than or equal to two, having leading and trailing edges which coincide with leading and trailing edges of a second input clock signal having the clock frequency of X [Hz], said flip-flop circuit comprises:

a first latch circuit for latching said input data signal in synchronism with a trailing edge of said input clock signal to produce a first latched signal;

a second latch circuit for latching said input data signal in synchronism with a leading edge of said input clock signal to produce a second latched signal as an output data signal;

an M frequency divider for frequency dividing said second latched signal on the basis of a dividing number M to produce a divided second latched signal having a divided frequency of X/(N×M) [Hz], where M represents a positive integer;

a third latch circuit for latching said first latched signal in synchronism with a leading edge of said divided second latched signal to produce a third latched signal as said leading phase comparison result signal;

a fourth latch circuit for latching said first latched signal in synchronism with a trailing edge of said divided second latched signal to produce a fourth latched signal; and a fifth latch circuit for latching said fourth latched signal in synchronism with a leading edge of said divided second latched signal to produce a fifth latched signal as said trailing phase comparison result signal.

5. A phase comparator as claimed in claim 4, wherein said leading phase comparison result signal has a logic "1" level when said leading phase comparison result signal indicates the lag phase of said input clock signal, said leading phase comparison result signal having a logic "0" level when said leading phase comparison result signal indicates the lead phase of said input clock signal, said trailing phase comparison result signal having the logic "1" level when said trailing phase comparison result signal indicates the lead phase of said input clock signal, said trailing phase comparison result signal having the logic "0" level when said trailing phase comparison result signal indicates the lag phase of said input clock signal, said logic circuit comprising:

a first AND gate supplied with said leading phase comparison result signal and an inverted trailing phase comparison result signal obtained by inverting said trailing phase comparison result signal, said first AND gate ANDing said leading phase comparison result signal and said inverted trailing phase comparison result signal to produce a first ANDed signal as said output up signal; and a second AND gate supplied with said trailing phase comparison result signal and an inverted leading phase comparison result signal obtained by inverting said leading phase comparison result signal, said second AND gate ANDing said trailing phase comparison result signal and said inverted leading phase comparison result signal to produce a second ANDed signal as said output down signal.

6. A phase comparator comprising:

first through N-th flip-flop circuits supplied with an input data signal having a bit rate of X [bps], where N represents a positive integer which is not less than two, said first through said N-th flip-flop circuits being supplied with first through N-th divided input clock signals, respectively, each having a divided clock frequency of X/N [Hz], each of said first through said N-th divided input clock signals having leading and trailing edges which coincide with leading and trailing edges of an original input clock signal having an original clock frequency of X [Hz], said first through said N-th divided input clock signals being phase shifted to one another by an angle of 360/N degrees, an n-th flip-flop circuit comparing an n-th divided input clock signal with a leading edge and a trailing edge of said input data signal to produce an n-th leading phase comparison result signal indicative of an n-th leading phase comparison result related to said leading edge of said input data signal and an n-th trailing phase comparison result signal indicative of an n-th trailing phase comparison result related to said trailing edge of said input data signal, where n represents a variable between 1 and N; and a logic circuit connected to said first through said N-th flip-flop circuits, said logic circuit producing an output up signal when all of said first through said N-th leading phase comparison result signals have a lag phase of said first through said N-th divided input clock signals and when any one of said first through said N-th trailing phase comparison result signals has a lag phase of said first through said N-th divided input clock signals, said logic circuit producing an output down signal when all of said first through said N-th trailing phase comparison result signals have a lead phase of said first through said N-th divided input clock signals and when any one of said first through said N-th leading phase comparison result signals has a lead phase of said first through said N-th divided input clock signals.

7. A phase comparator as claimed in claim 6, wherein said n-th flip-flop circuit comprises:

a first latch circuit for latching said input data signal in synchronism with a trailing edge of said n-th divided input clock signal to produce a first latched signal;

a second latch circuit for latching said input data signal in synchronism with a leading edge of said n-th divided input clock signal to produce a second latched signal as an n-th output data signal;

an M frequency divider for frequency dividing said second latched signal on the basis of a dividing number M to produce a divided second latched signal having a divided frequency of X/(N×M), where M represents a positive integer;

a third latch circuit for latching said first latched signal in synchronism with a leading edge of said divided second latched signal to produce a third latched signal as said n-th leading phase comparison result signal;

a fourth latch circuit for latching said first latched signal in synchronism with a trailing edge of said divided second latched signal to produce a fourth latched signal; and a fifth latch circuit for latching said fourth latched signal in synchronism with a leading edge of said divided second latched signal to produce a fifth latched signal as said n-th trailing phase comparison result signal.

8. A phase comparator as claimed in claim 6, wherein said first through said N-th leading phase comparison result signals have a logic "1" level when said first through said N-th leading phase comparison result signal indicate the lag phase of said first through said N-th divided input clock signals, respectively, said first through said N-th leading phase comparison result signals having a logic "0" level when said first through said N-th leading phase comparison result signals indicate the lead phase of said first through said N-th divided input clock signals, respectively, said first through said N-th trailing phase comparison result signals having the logic "1" level when said first through said N-th trailing phase comparison result signals indicate the lead phase of said input clock signal, said first through said N-th trailing phase comparison result signals having the logic "0" level when said first through said N-th trailing phase comparison result signals indicate the lag phase of said first through said N-th input clock signals, respectively, said logic circuit comprising:

a leading comparison processing gate supplied with said first through said N-th leading phase comparison result signals, said leading comparison processing gate ANDing said first through said N-th leading phase comparison result signals to produce a processed leading phase comparison result signal;

a trailing comparison processing gate supplied with said first through said N-th trailing phase comparison result signals, said trailing comparison processing gate ANDing said first through said N-th trailing phase comparison result signals to produce a processed trailing phase comparison result signal;

a first AND gate supplied with said processed leading phase comparison result signal and an inverted processed trailing phase comparison result signal obtained by inverting said processed trailing phase comparison result signal, said first AND gate ANDing said processed leading phase comparison result signal and said inverted processed trailing phase comparison result signal to produce a first ANDed signal as said output up signal; and a second AND gate supplied with said processed trailing phase comparison result signal and an inverted processed leading phase comparison result signal obtained by inverting said processed leading phase comparison result signal, said second AND gate ANDing said processed trailing phase comparison result signal and said inverted processed leading phase comparison result signal to produce a second ANDed signal as said output down signal.

9. A clock data recovery circuit comprising:

a phase comparator supplied with an input data signal and an input clock signal, said phase comparator detecting a phase difference between said input data signal and said input clock signal to produce an output up signal or an output down signal, said phase comparator producing an output data signal;

a comparison result integrating circuit, connected to said phase comparator, for integrating said output up signal and said output down signal to produce a control signal; and a phase varying circuit, connected to said comparison result integrating circuit, for varying a phase of an oscillation clock signal in response to said control signal to produce said input clock signal, said phase comparator comprising:

a flip-flop circuit supplied with said input data signal and said input clock signal, said flip-flop circuit comparing said input clock signal with a leading edge and a trailing edge of said input data signal to produce a leading phase comparison result signal indicative of a leading phase comparison result related to said leading edge of said input data signal and a trailing phase comparison result signal indicative of a trailing phase comparison result related to said trailing edge of said input data signal; and a logic circuit connected to said flip-flop circuit, said logic circuit producing said output up signal when both of said leading and said trailing phase comparison result signals indicate a lag phase of the input clock signal, said logic circuit producing said output down signal when both of said leading and said trailing phase comparison result signals indicate a lead phase of said input clock signal, wherein the logic circuit produces the output up sianal based on both of said leading and said trailing phase comparison result signals, and wherein the logic circuit produces the output down signal based on both of said leading and said trailing phase comparison result signals.

10. A clock data recovery circuit as claimed in claim 9, wherein said phase varying circuit is supplied with said oscillation clock signal from the exterior.

11. A clock data recovery circuit comprising:

a phase comparator supplied with an input data signal and an input clock signal, said input data signal having a data rate of X [bps], said input clock signal having a clock frequency of X/N [Hz], where N represents a natural number that is greater than or equal to two, having leading and trailing edges which coincide with leading and trailing edges of a second input clock signal having the clock frequency of X [Hz], said phase comparator detecting a phase difference between said input data signal and said input clock signal to produce an output up signal or an output down signal, said phase comparator producing an output data signal;

a comparison result integrating circuit, connected to said phase comparator, for integrating said output up signal and said output down signal to produce a control signal; and a phase varying circuit, connected to said comparison result integrating circuit, for varying a phase of an oscillation clock signal in response to said control signal to produce said input clock signal, said phase comparator comprising:

a flip-flop circuit supplied with said input data signal and said input clock signal, said flip-flop circuit comparing said input clock signal with a leading edge and a trailing edge of said input data signal to produce a leading phase comparison result signal indicative of a leading phase comparison result related to said leading edge of said input data signal and a trailing phase comparison result signal indicative of a trailing phase comparison result related to said trailing edge of said input data signal; and a logic circuit connected to said flip-flop circuit, said logic circuit producing an output up signal when both of said leading and said trailing phase comparison result signals indicate a lag phase of the input clock signal, said logic circuit producing an output down signal when both of said leading and said trailing phase comparison result signals indicate a lead phase of said input clock signal.

12. A clock data recovery circuit as claimed in claim 11, wherein said phase varying circuit is supplied with said oscillation clock signal from the exterior.

13. A clock data recovery circuit comprising:

a phase comparator supplied with an input data signal having a bit rate of X [bps], where N represents a positive integer which is not less than two, said phase comparator being supplied with first through N-th divided input clock signals each having a divided clock frequency of X/N [Hz], each of said first through said N-th divided input clock signals having leading and trailing edges which coincide with leading and trailing edges of an original input clock signal having an original clock frequency of X [Hz], said first through said N-th divided input clock signals being phase shifted to one another by an angle of 360/N degrees, said phase comparator detecting a phase difference between said input data signal and said first through said N-th divided input clock signals to produce an output up signal or an output down signal, said phase comparator producing first through N-th output data signals;

a comparison result integrating circuit, connected to said phase comparator, for integrating said output up signal and said output down signal to produce a control signal; and a phase varying circuit, connected to said comparison result integrating circuit, for varying a phase of an oscillation clock signal in response to said control signal to produce said first through said N-th divided input clock signals, said phase comparator comprising:

first through N-th flip-flop circuits supplied with said input data signal, said first through said N-th flip-flop circuits being supplied with said first through said N-th divided input clock signals, respectively, an n-th flip-flop circuit comparing an n-th divided input clock signal with a leading edge and a trailing edge of said input data signal to produce an n-th leading phase comparison result signal indicative of an n-th leading phase comparison result related to said leading edge of said input data signal and an n-th trailing phase comparison result signal indicative of an n-th trailing phase comparison result related to said trailing edge of said input data signal, where n represents a variable between 1 and N; and a logic circuit connected to said first through said N-th flip-flop circuits, said logic circuit producing said output up signal when all of said first through said N-th leading phase comparison result signals have a lag phase of said first through said N-th divided input clock signals and when any one of said first through said N-th trailing phase comparison result signals has a lag phase of said first through said N-th divided input clock signals, said logic circuit producing said output down signal when all of said first through said N-th trailing phase comparison result signals have a lead phase of said first through said N-th divided input clock signals and when any one of said first through said N-th leading phase comparison result signals has a lead phase of said first through said N-th divided input clock signals.

14. A clock data recovery circuit as claimed in claim 13, wherein said phase varying circuit is supplied with said oscillation clock signal from the exterior.

15. A clock data recovery circuit as claimed in claim 11, wherein the logic circuit produces the output up signal based on both of said leading and said trailing phase comparison result signals, and wherein the logic circuit produces the output down signal based on both of said leading and said trailing phase comparison result signals.

* * * * *